＃US005926705A

United States Patent [19]
Nishida

[11] Patent Number: 5,926,705
[45] Date of Patent: Jul. 20, 1999

[54] METHOD FOR MANUFACTURING A SEMICONDUCTOR DEVICE WITH STABILIZATION OF A BIPOLAR TRANSISTOR AND A SCHOTTKY BARRIER DIODE

[75] Inventor: Takuo Nishida, Tokyo, Japan

[73] Assignee: NEC Corporation, Tokyo, Japan

[21] Appl. No.: 08/736,037

[22] Filed: Oct. 21, 1996

[30] Foreign Application Priority Data

Oct. 19, 1995 [JP] Japan .................................... 7-296276

[51] Int. Cl.$^6$ ............................................... H01L 21/8249
[52] U.S. Cl. .......................... 438/234; 438/202; 438/237; 438/656; 438/657; 438/753; 148/DIG. 9; 148/DIG. 51; 148/DIG. 131; 148/DIG. 139; 156/643.1; 156/646.1
[58] Field of Search ..................................... 438/202, 234, 438/237, 656, 657, 745, 753, FOR 219; 148/DIG. 9, DIG. 51, DIG. 131, DIG. 139; 156/625.1, 643.1, 646.1

[56] References Cited

U.S. PATENT DOCUMENTS 4,485,550  12/1984  Koeneke et al. ........................... 29/571
5,338,698   8/1994  Subbanna .................................. 437/40

FOREIGN PATENT DOCUMENTS

| 62-94937 | 5/1987 | Japan . |
| 5-114702 | 5/1993 | Japan . |
| 6-69168  | 3/1994 | Japan . |
| 6-151390 | 5/1994 | Japan . |
| 6-151736 | 5/1994 | Japan . |

*Primary Examiner*—Peter Toby Brown
*Assistant Examiner*—Long Pham
*Attorney, Agent, or Firm*—Foley & Lardner

[57] ABSTRACT

In a method for manufacturing an LDD-structured MOS transistor and a bipolar transistor, a gate insulating layer is formed on a MOS transistor region and a bipolar transistor region. Then, a gate electrode is formed on the MOS transistor region. Then, an insulating layer is formed on the entire surface, and as etched back by a reactive ion etching process to form a sidewall spacer. The MOS transistor region and the bipolar transistor region are etched by a wet etching process using the gate electrode and its sidewall spacer as a mask.

16 Claims, 12 Drawing Sheets

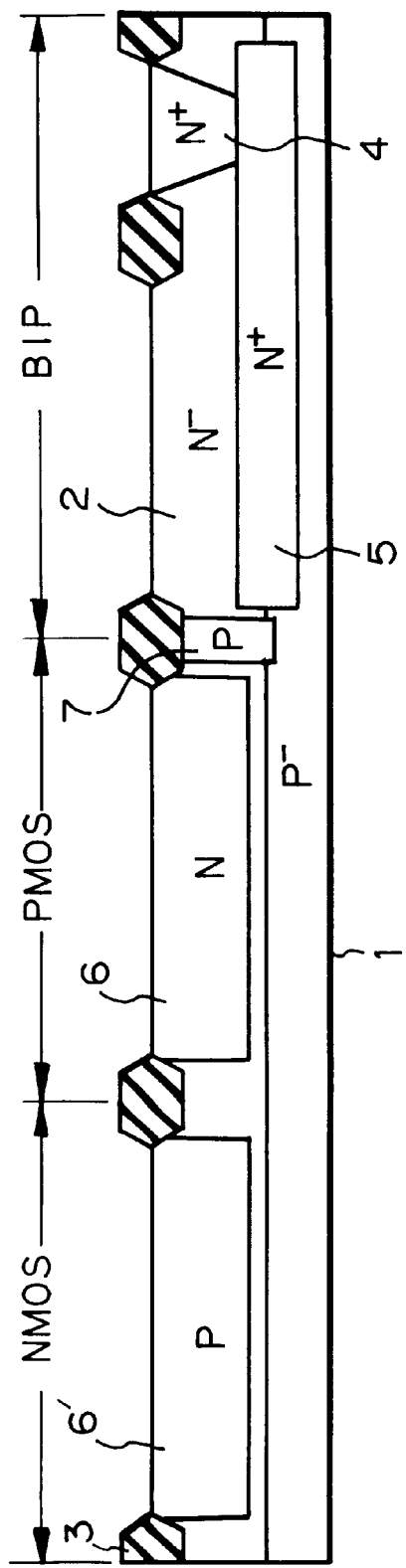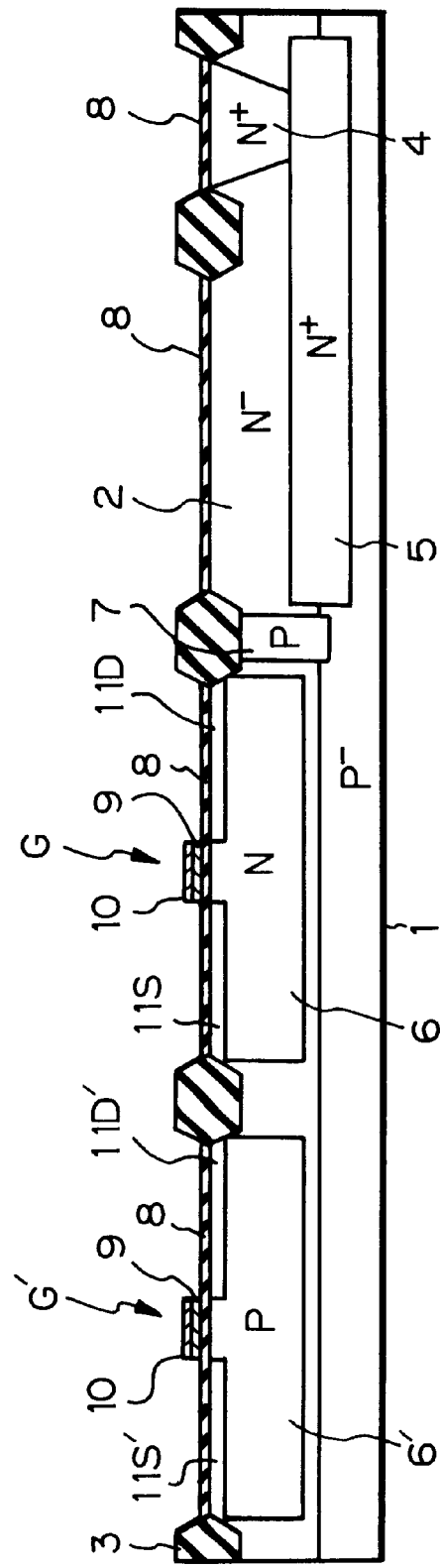

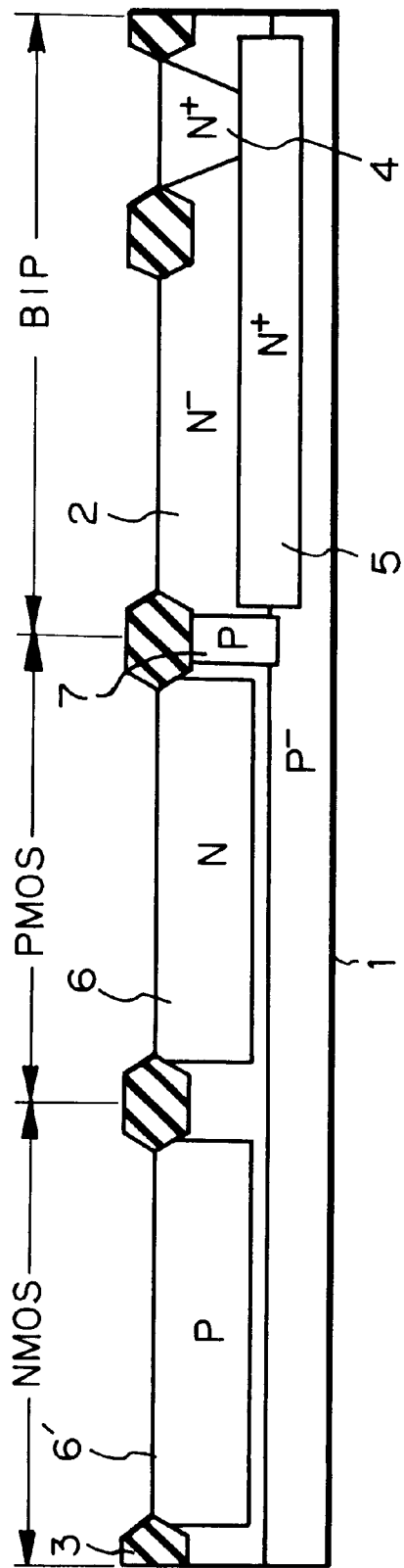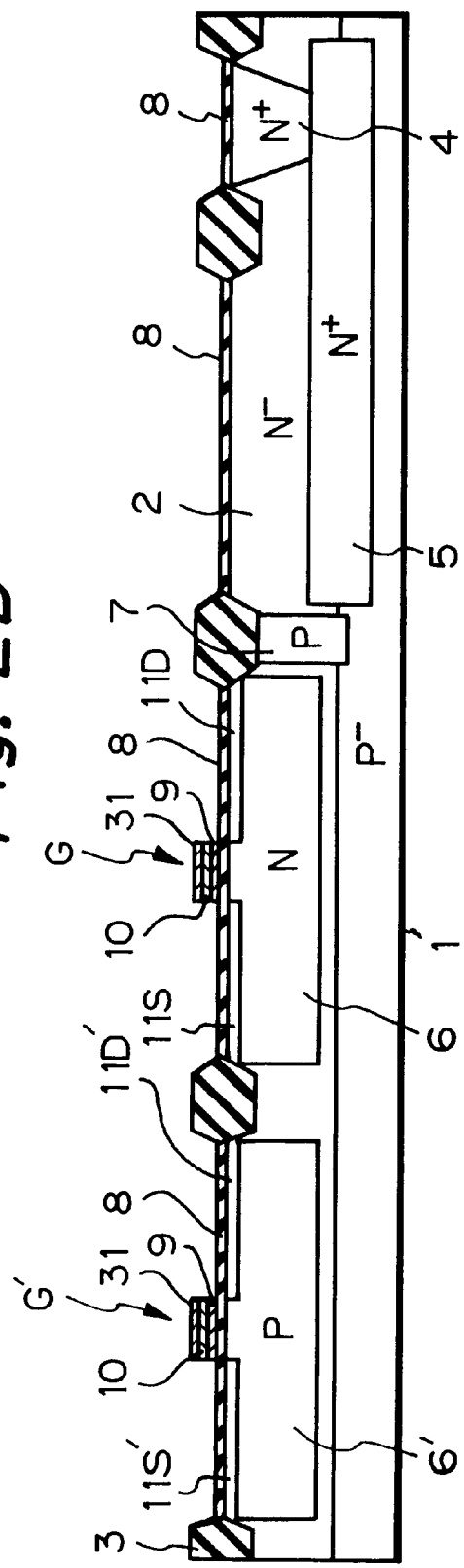

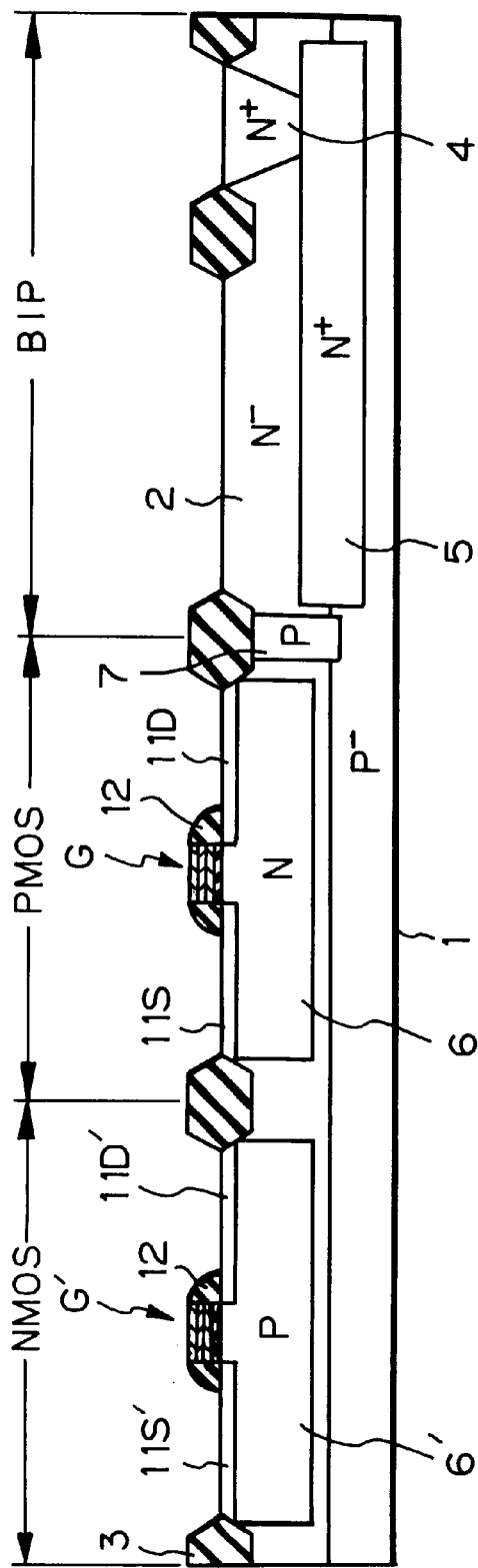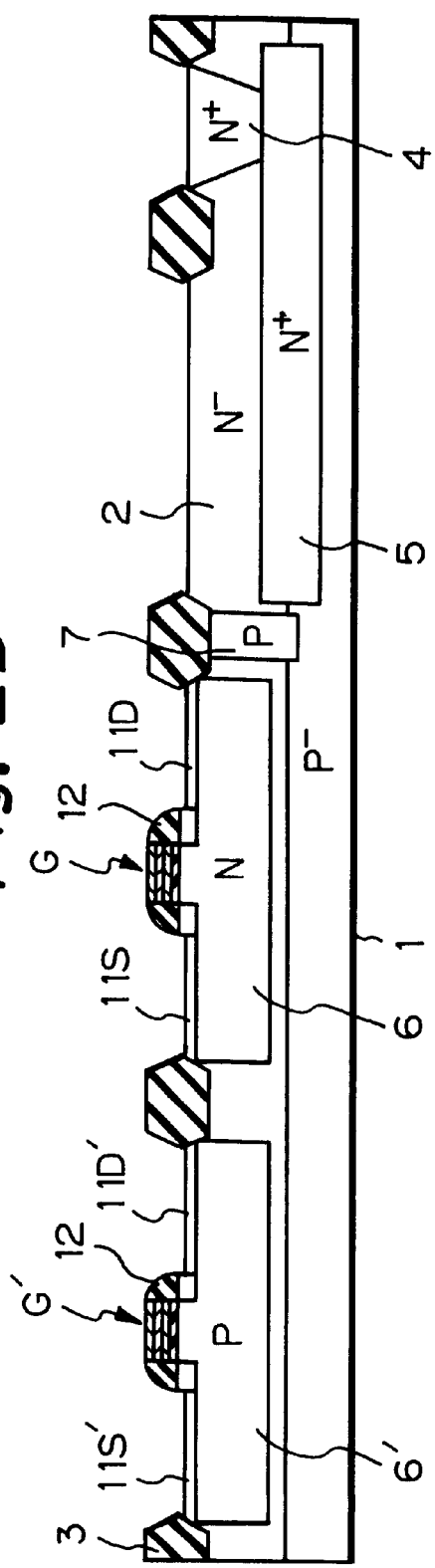

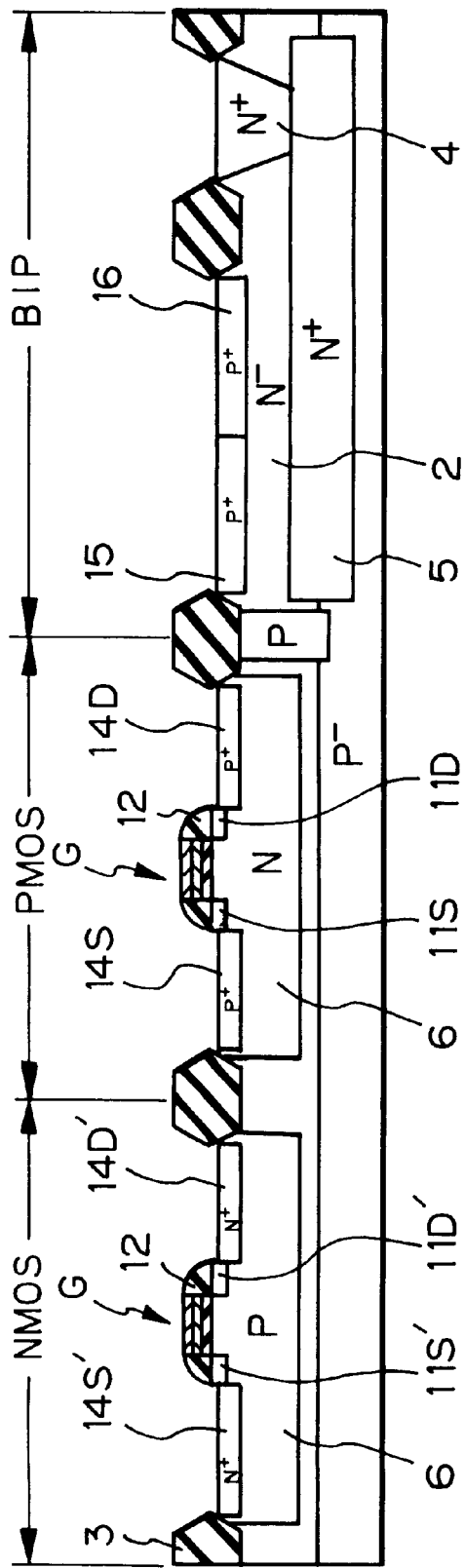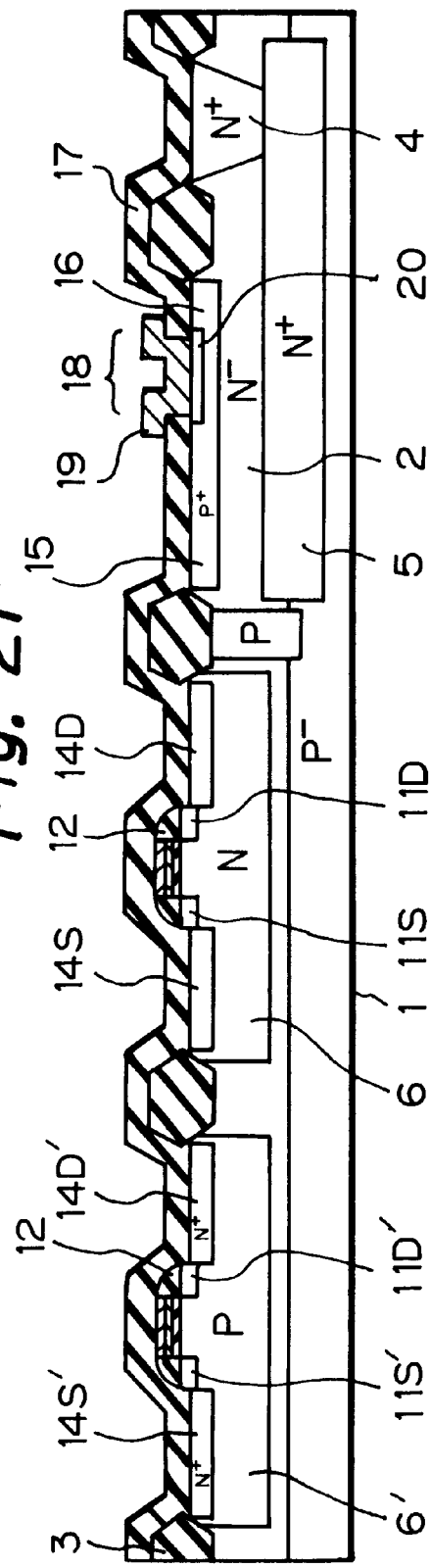

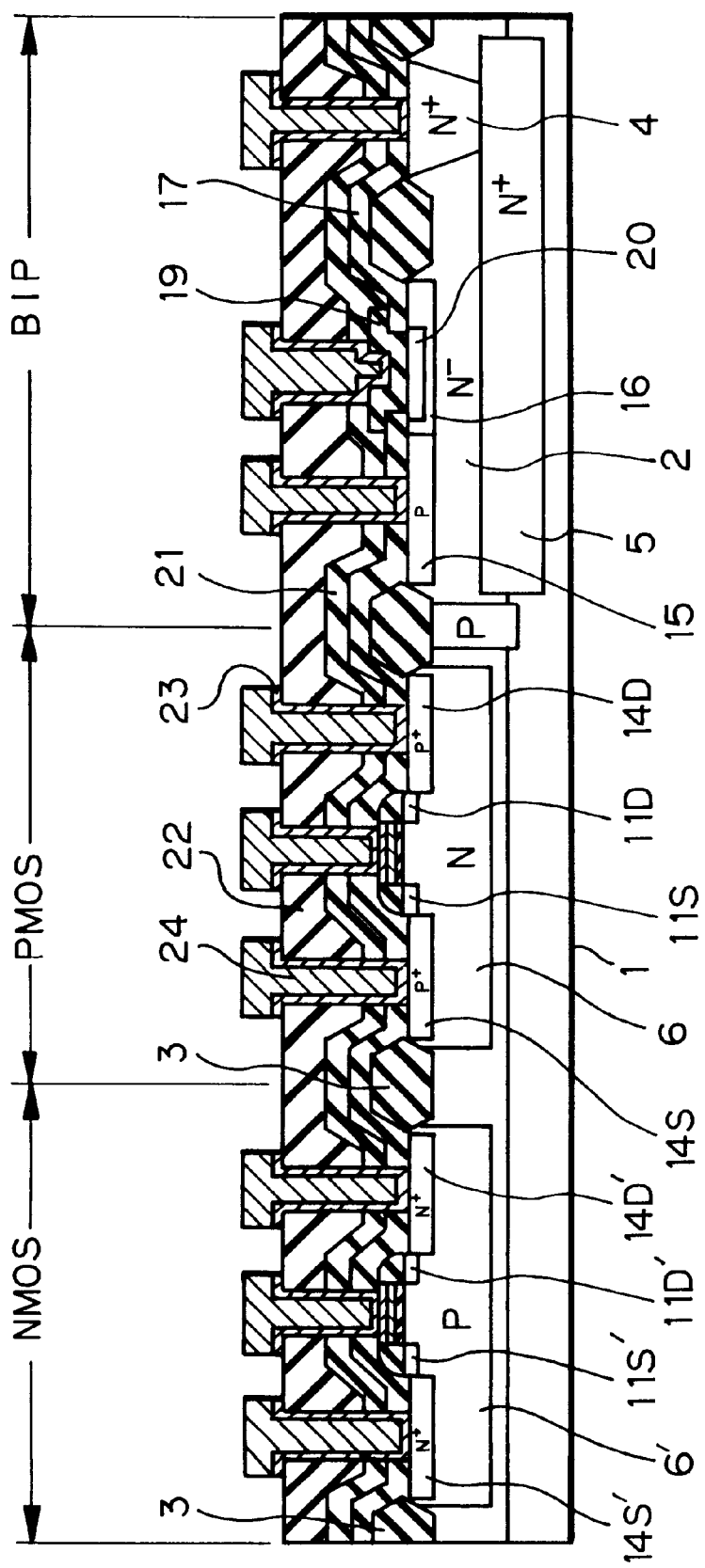

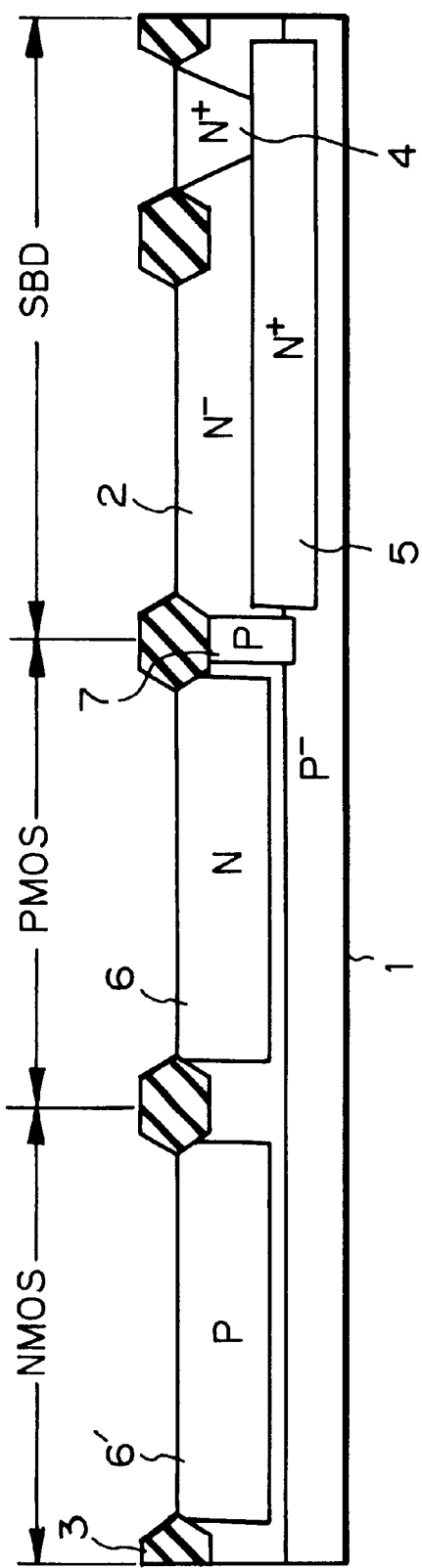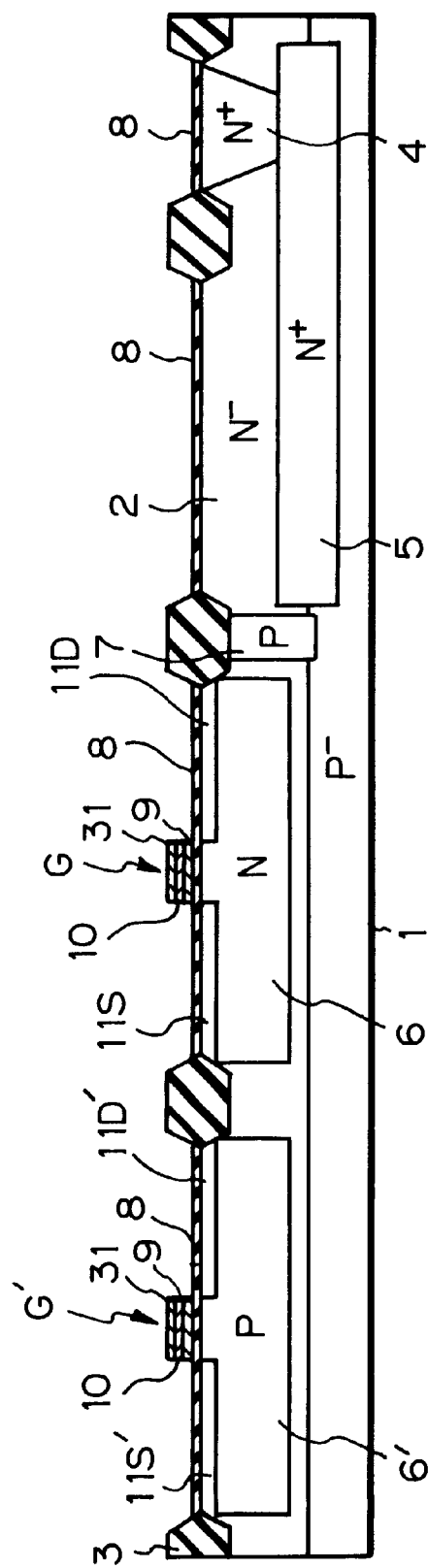

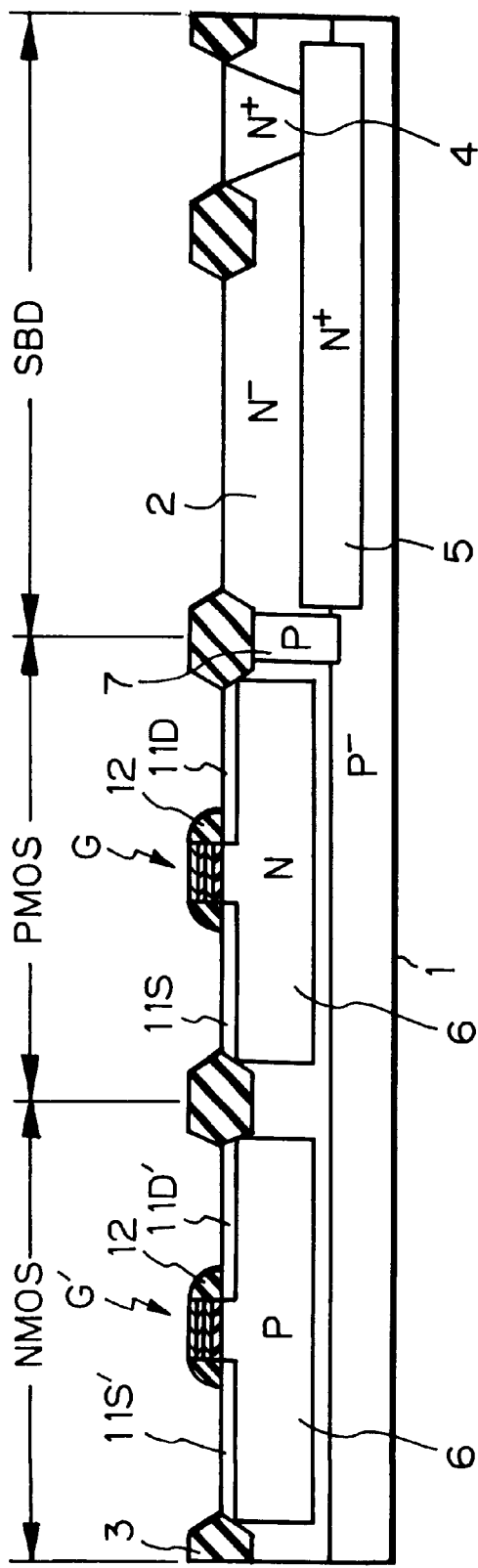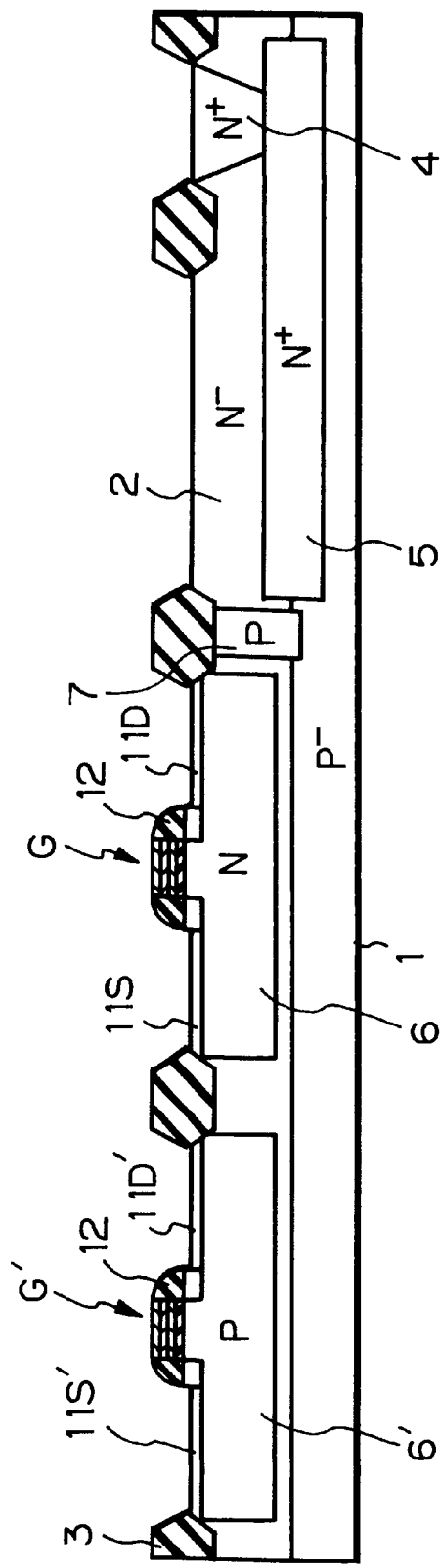

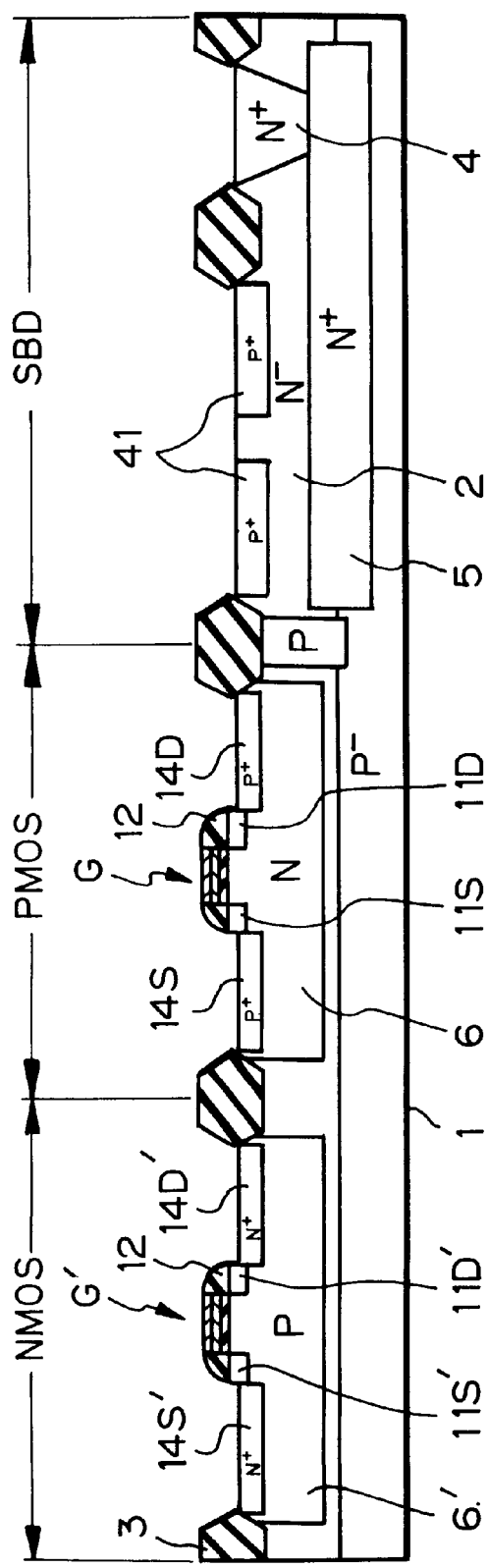
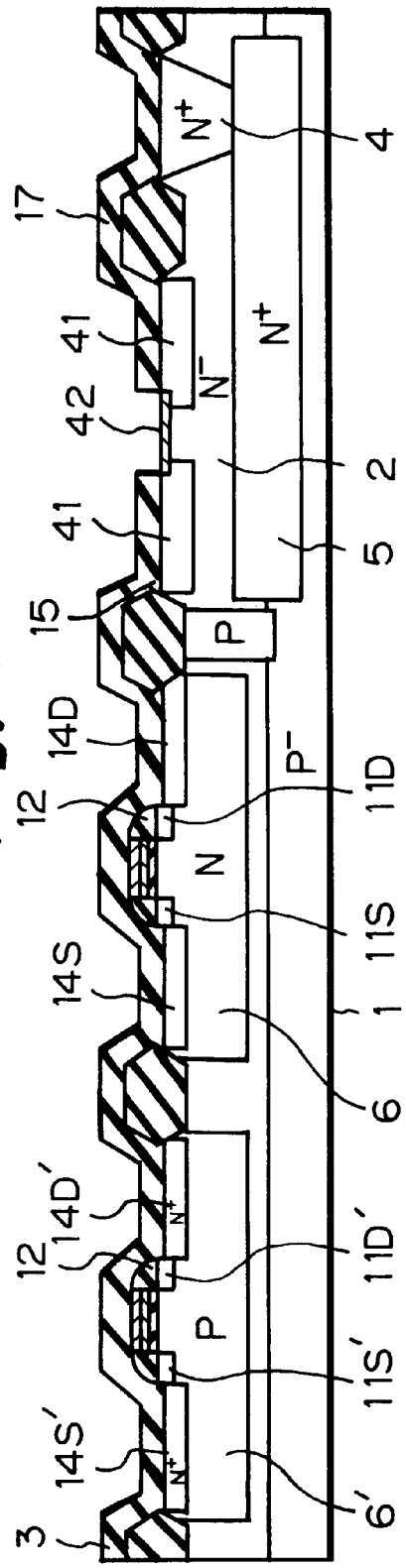
Fig. 3E
Fig. 3F

METHOD FOR MANUFACTURING A SEMICONDUCTOR DEVICE WITH STABILIZATION OF A BIPOLAR TRANSISTOR AND A SCHOTTKY BARRIER DIODE

BACKGROUND OF THE INVENTION

1. Field of the Invention

The present invention relates to a method for manufacturing a semiconductor device, and more particularly, to a method for manufacturing a lightly doped drain (LDD) type MOS transistor, and either a bipolar transistor or a Schottky barrier diode (SBD) on the same substrate.

2. Description of the Related Art

In a fine structured MOS device, in order to avoid deterioration due to hot carriers, an LDD structure has been broadly used.

In a prior art method for manufacturing an LDD-structured MOS transistor and either a bipolar transistor or an SBD, a gate insulating layer is formed on a MOS transistor region and either a bipolar transistor or an SBD region. Then, a gate electrode is formed on the MOS transistor region. Then, an insulating layer is formed on the entire surface, and is etched back by a reactive ion etching (RIE) process to form a sidewall spacer only on a sidewall of the gate electrode. Then, in order to remove a part of either the bipolar transistor or SBD region damaged by the RIE process, a photoresist pattern is formed to cover the MOS transistor region, and the damaged part is etched by a chemical etching process using the photoresist pattern as a mask. This will be explained later in detail.

In the above-described prior art manufacturing method, however, an additional photolithography process for forming the photoresist pattern is required, thus increasing the manufacturing cost.

SUMMARY OF THE INVENTION

It is an object of the present invention to reduce the manufacturing cost of a semiconductor device including a MOS transistor and either a bipolar transistor or an SBD.

According to the present invention, in a method for manufacturing an LDD-structured MOS transistor and a bipolar transistor (or SBD), a gate insulating layer is formed on a MOS transistor region and a bipolar transistor (or SBD) region. Then, a gate electrode is formed on the MOS transistor region. Then, an insulating layer is formed on the entire surface, and is etched back by an RIE process to form a sidewall spacer. The MOS transistor region and the bipolar transistor region are etched by a wet etching process using the gate electrode and its sidewall spacer as a mask.

Thus, the part of either the bipolar transistor or SBD that is damaged by the RIE process is removed without an additional photolithography process.

BRIEF DESCRIPTION OF THE DRAWINGS

The present invention will be more clearly understood from the description as set forth below, as compared with the prior art, and with reference to the accompanying drawings, wherein:

FIGS. 1A through 1G are cross-sectional views showing prior art method for manufacturing a BiCMOS device;

FIGS. 2A through 2G are cross-sectional views showing first embodiment of the method for manufacturing a semiconductor device; and FIGS. 3A through 3G are cross-sectional views showing second embodiment of the method for manufacturing a semiconductor device.

DESCRIPTION OF THE PREFERRED EMBODIMENTS

Figure 1C:
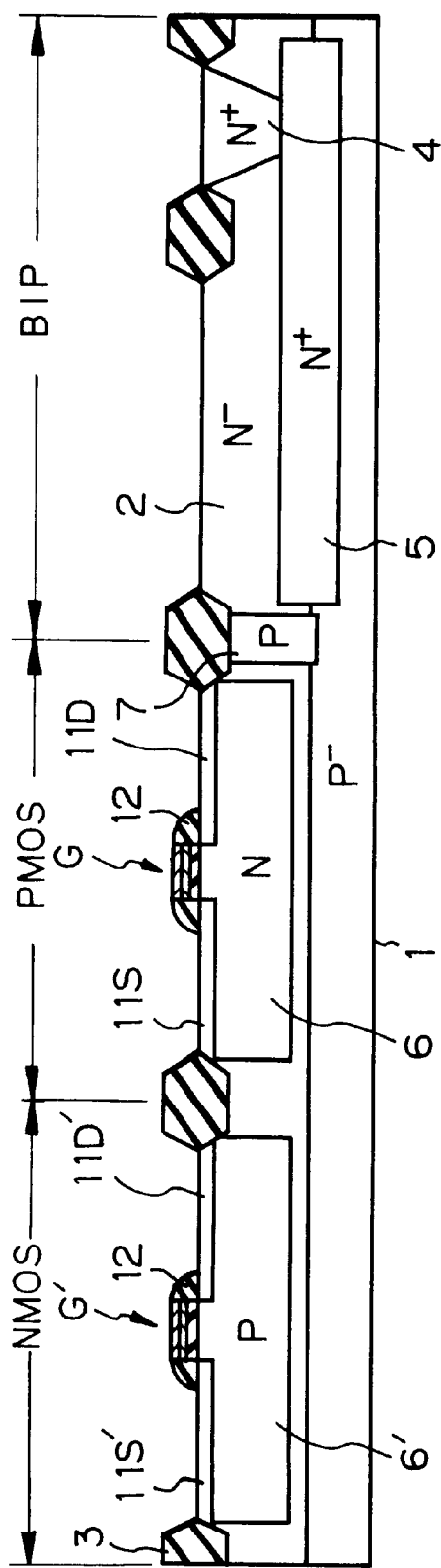

Before the description of the preferred embodiments, a prior art method for manufacturing a BiCMOS-type device will be explained with reference to FIGS. 1A through 1G.

First, referring to FIG. 1A, an $N^-$-type epitaxial silicon layer 2 is grown on a P-type monocrystalline silicon substrate 1. Then, a field silicon oxide layer 3 is formed by a local oxidation of silicon (LOCOS) process to partition a PMOS region, an NMOS region and a bipolar transistor (BIP) region. Then, an $N^+$-type collector impurity diffusion region 4 is selectively formed in a collector take-out portion of the BIP region, and an $N^+$-type buried layer 5 is selectively formed within the BIP region. Also, phosphorus ions are implanted into the PMOS region, so that an N-type well 6 is formed within the PMOS region, and boron ions are implanted into the No region, so that a P-type well 6' is formed within the NMOS region. Further, boron ions are implanted into a portion between the $N^-$-type epitaxial silicon layer 2 and the N-type well 6, so that a P-type channel stopper 7 is formed.

Next, referring to FIG. 1B, a gate silicon oxide layer 8 is grown by thermally oxidizing the $N^-$-type epitaxial silicon layer 2, the $N^-$-type collector impurity region 4, the N-type well 6 and the P-type well 6'. Then, a phosphorus-doped polycrystalline silicon layer 9 is deposited by a chemical vapor deposition (CVD) process, and a refractory metal layer 10, made of WSi or the like, is deposited on the polycrystalline silicon layer 9 by a sputtering process. Then, the polycrystalline silicon layer 9 and the refractory metal layer 10 are patterned by a photolithography and etching process to form a gate electrode G in the PMOS region and a gate electrode G' in the NMOS region. Then, boron ions are implanted into the PMOS region by using the gate electrode G and a photoresist pattern (not shown) as a mask, to form P-type impurity diffusion (source/drain) regions 11S and 11D having a low concentration for an LDD structure. Similarly, phosphorus ions are implanted into the NMOS region by using the gate electrode G' and a photoresist pattern (not shown) as a mask, to form N-type impurity diffusion (source/drain) regions 11S' and 11D' having a low concentration for an LDD structure.

Next, referring to FIG. 1C, about a 2000 Å thick silicon oxide layer is deposited by a CVD process on the entire surface. Then, the silicon oxide layer is etched back anisotropically by using an RIE process with a gas of $CHF_3$ and $O_2$ to leave it as a sidewall spacer 12 on the sidewalls of the gate electrodes G and G'.

Figure 1D:
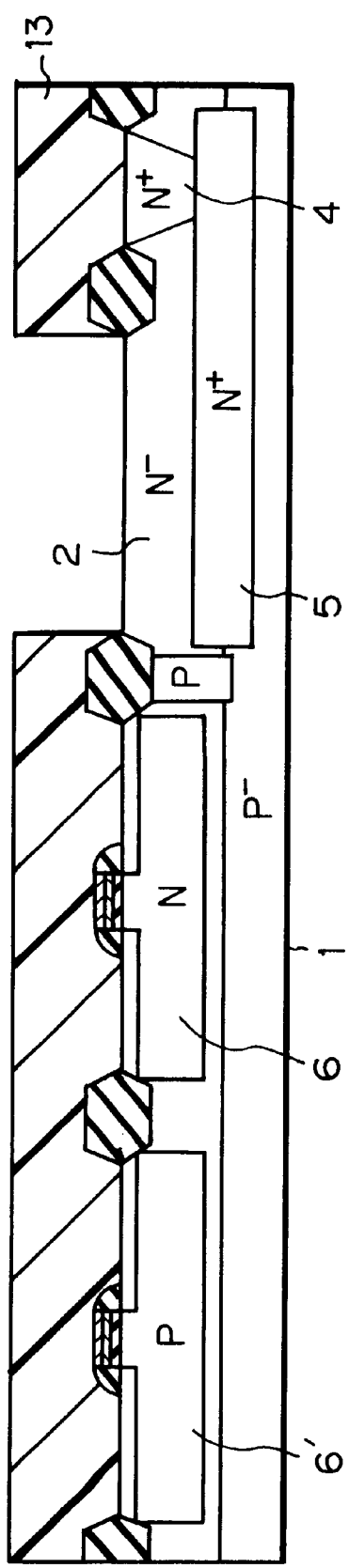

Next, referring to FIG. 1D, a photoresist pattern 13 is formed to cover the $N^+$-type collector impurity diffusion region 4, the PMOS region and the NMOS region. Then, the $N^-$-type epitaxial silicon layer 2 is etched by using a chemical dry etching process with a gas of $CF_4$, or the like, using the photoresist pattern 13 as a mask. In this case, only a part of the $N^-$-type epitaxial silicon layer 2, having a thickness of about 0.01 to 0.02 $\mu$m which is damaged by the RIE process for forming the sidewall spacer 12, is removed. Note that, if the damaged part of the $N^-$-type epitaxial silicon layer 2 remains and serves as a base region of a bipolar transistor, electrons are recombined with holes within the base region, to reduce a current amplification, i.e., to deteriorate the linearity of the current amplification. Then, the photoresist pattern 13 is removed.

Figure 1E:
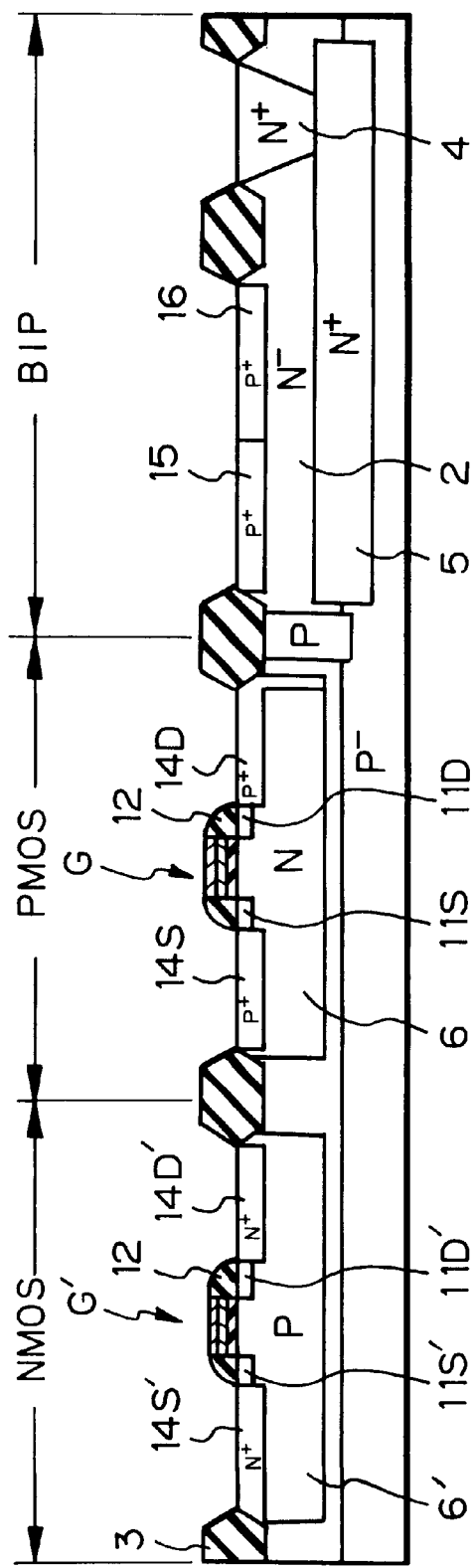

Next, referring to FIG. 1E, boron ions are implanted into the PMOS region by using the gate electrode G, its sidewall spacer 12 and a photoresist pattern (not shown) as a mask, to form P-type impurity diffusion, i.e., source/drain regions 14S and 14D, respectively, having a high concentration for the LDD structure. Similarly, arsenic ions are implanted into the NMOS region by using the gate electrode G', its sidewall spacer 12 and a photoresist pattern (not shown) as a mask, to form P-type impurity diffusion (source/drain) regions 14S' and 14D' having a high concentration for the LDD structure. Note that a $P^+$-type graft base region 15 is formed simultaneously with the formation of the P-type impurity diffusion regions 14S and 14D. Further, boron ions are implanted into the BIP region using a photoresist pattern (not shown) as a mask to form a P-type base region 16.

Figure 1F:
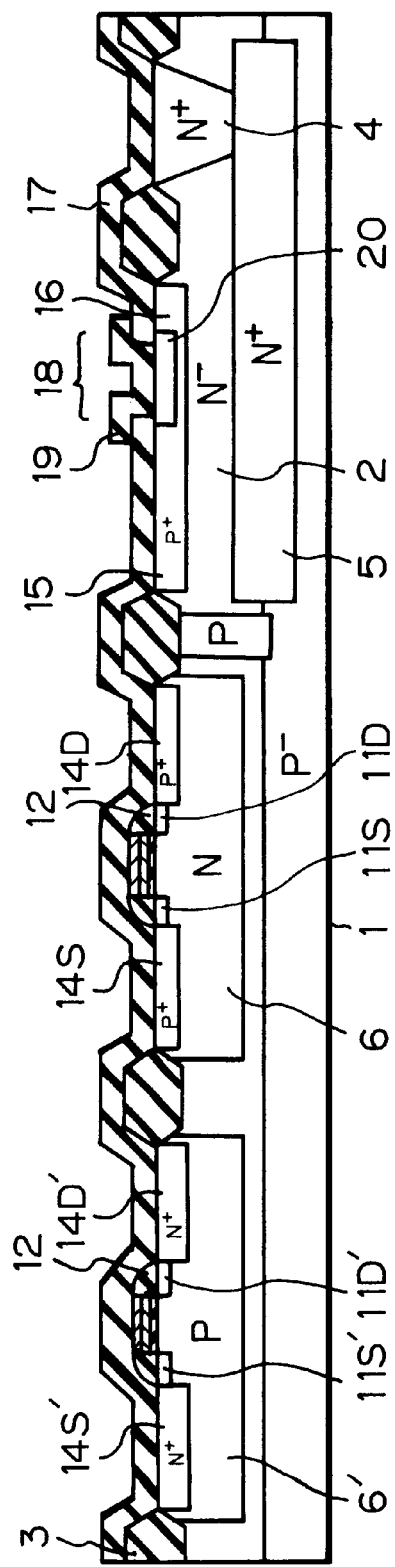

Next, referring to FIG. 1F, a silicon oxide layer 17 is grown by a CVD process on the entire surface. Then, an emitter contact hole 18 is perforated in the silicon oxide layer 17 by a photolithography and RIE process. Then, a polycrystalline silicon layer 19 is deposited by a CVD process, and arsenic ions are implanted thereinto. Then, a heating operation is carried out in a nitrogen atmosphere for about 10 to 20 minutes, to form an emitter region 20. Then, the polycrystalline silicon layer 19 is patterned by a photolithography and etching process, to leave the polycrystalline silicon layer 19 as an emitter electrode.

Figure 1G:
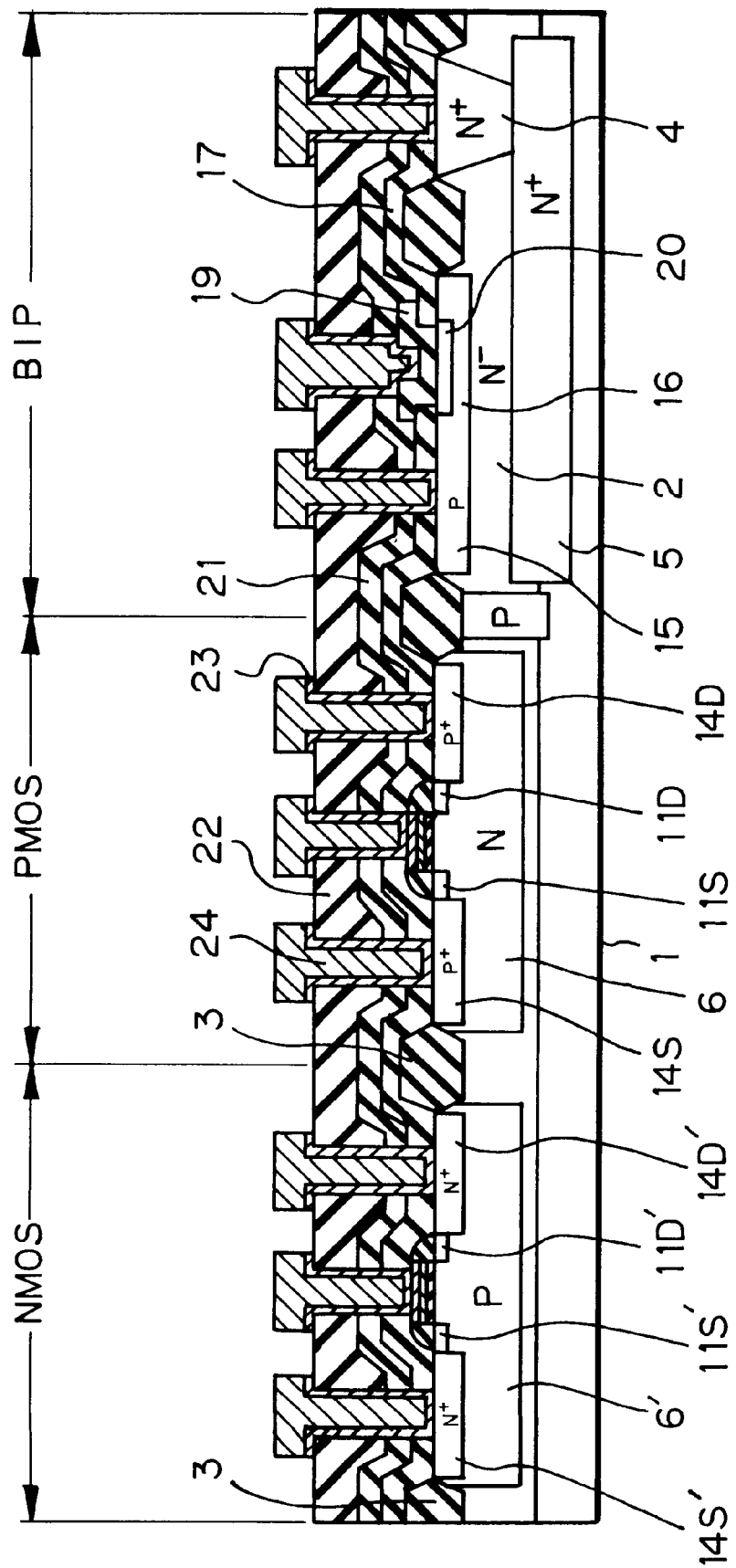

Finally, referring to FIG. 1G, a silicon oxide layer 21 and a boron-doped phosphosilicate glass (BPSG) layer 22 are sequentially formed by a CVD process. Subsequently, a barrier metal layer 23 and an aluminum electrode layer 24 are sequentially formed by a sputtering process, and are patterned. Thus, the BiCMOS device is completed.

In the above-described manufacturing method as shown in FIGS. 1A through 1G, however, a photolithography process for forming the photoresist pattern 13 is required, thus increasing the manufacturing cost.

FIGS. 2A through 2G are cross-sectional views showing a first embodiment of the method for manufacturing a semiconductor device according to the present invention.

First, referring to FIG. 2A, in the same way as shown in FIG. 1A, an $N^-$-type epitaxial silicon layer 2 is grown on a P-type monocrystalline silicon substrate 1. Then, a field silicon oxide layer 3 is formed by a LOCOS process to partition a PMOS region, an NMOS region and a BIP region. Then, an $N^+$-type collector impurity diffusion region 4 is selectively formed in a collector take-out portion of the BIP region, and an $N^+$-type buried layer 5 is selectively formed within the BIP region. Also, phosphorus ions are implanted into the PMOS region, so that an N-type well 6 is formed within the PMOS region, and boron ions are implanted into the NMOS region, so that a P-type well 6' is formed within the NMOS region. Further, boron ions are implanted into a portion between the $N^-$-type epitaxial silicon layer 2 and the N-type well 6, so that a P-type channel stopper 7 is formed.

Next, referring to FIG. 2B, in a similar way to that shown in FIG. 1B, about a 100 to 150 Å thick gate silicon oxide layer 8 is grown by thermally oxidizing the $N^-$-type epitaxial silicon layer 2, the $N^+$-type collector impurity region 4, the N-type well 6, and the P-type well 6', in a $H_2$—$O_2$ atmosphere at a temperature of about 750 to 850° C. Then, about a 1000 to 2000 Å thick phosphorus-doped polycrystalline silicon layer 9 is deposited by a CVD process, and about a 1000 to 2000 Å thick refractory metal layer 10, made of WSi or the like, is deposited on the polycrystalline silicon layer 9 by a sputtering process. Further, a protection layer 31 made of silicon or the like is deposited on the refractor metal layer 10 by a CVD process. Note that the protection layer 31 prevents the refractory metal layer 10 from being etched by ammonia water. The ammonia water will be used later for etching silicon in a step shown in FIG. 2D. Then, as shown in FIG. 2B, the polycrystalline silicon layer 9, the refractory metal layer 10 and the protection layer 31 are patterned by a photolithography and etching process to form a gate electrode G in the PMOS region and a gate electrode G' in the NMOS region. Then, about 1.0 to $3.0 \times 10^{13}$ boron ions per $cm^2$ are implanted into the PMOS region by using the gate electrode G and a photoresist pattern (not shown) as a mask, to form P-type impurity diffusion, i.e., source/drain regions 11S and 11D, respectively, having a low concentration for an LLD structure. Similarly, about 1.0 to $3.0 \times 10^{13}$ phosphorus ions per $cm^2$ are implanted into the NMOS region by using the gate electrode G' and a photoresist pattern (not shown) as a mask, to form N-type impurity diffusion, i.e., source/drain regions 11S' and 11D', respectively having a low concentration for an LDD structure.

Next, referring to FIG. 2C, in the same way as shown in FIG. 1C, about a 1500 to 2500 Å thick silicon oxide layer is deposited by a CVD process on the entire surface. Then, the silicon oxide layer is etched back anistropically by using an RIE process with a gas of $CH_3$ and $O_2$, to leave it as a sidewall spacer 12 on the sidewalls of the gate electrodes G and G'.

Next, referring to FIG. 2D, the $N^-$ type epitaxial layer 2, the $N^+$-type collector impurity diffusion region 4, the P-type impurity diffusion regions 11S and 11D, and the N-type impurity diffusion regions 11S and 11D are etched for about 20 minutes by ammonia water in which $NH_4OH:H_2O_2:H_2O=1:4:20$. As stated above, the gate electrodes G and G' are hardly etched by ammonia water due to the presence of the protection layer 31. If the protection layer 31 is absent, the refractory metal layer 10 is etched by ammonia water, so that the bipolar region BIP may be contaminated by etched refractory metal. In this case, only a part of the $N^-$-type epitaxial silicon layer 2, having a thickness of about 0.01 to 0.02 μm which is damaged by the RIE process for forming the sidewall spacer 12, is removed simultaneously with removing the parts of the $N^+$-type collector impurity region 4, the P-type impurity diffusion regions 11S and 11D, and the N-type impurity diffusion regions 11S' and 11D'.

Next, referring to FIG. 2E, in the same way as shown in FIG. 1E, about 1.0 to $5.0 \times 10^{15}$ boron ions per $cm^2$ are implanted into the PMOS region by using the gate electrode G, its sidewall spacer 12 and a photoresist pattern (not shown) as a mask, to form P-type impurity diffusion, i.e., source/drain regions 14S and 14D'respectively, having a high concentration for the LDD stricture. Similarly, about 1.0 to $5.0 \times 10^{15}$ arsenic ions per $cm^2$ are implanted into the NMOS region by using the gate electrode G', its sidewall spacer 12 and a photoresist pattern (not shown) as a mask, to form N-type impurity diffusion, i.e., source/drain regions 14S' and 14D' having a high concentration for the LDD structure. Note that a $P^+$-type graft base region 15 is formed simultaneously with the formation of the P-type impurity diffusion regions 14S and 14D. Further, about 1.0 to $5.0 \times 10^{13}$ boron ions per $cm^2$ are implanted into the BIP region using a photoresist pattern (not shown) as a mask to form a P-type base region 16.

Next, referring to FIG. 2F, in the same way as in FIG. 1F, about a 2000 Å thick silicon oxide layer 17 is grown by a CVD process on the entire surface. Then, an emitter contact hole 18 is perforated in the silicon oxide layer 17 by a photolithography and RIE process. Then, about a 1500 to 2000 Å thick polycrystalline silicon layer 19 is deposited by a CVD process, and about $5 \times 10^{15}$ to $5 \times 10^{16}$ arsenic ions per cm$^2$ are implanted thereinto. Then, a heating operation is carried out in a nitrogen atmosphere for about 10 to 20 minutes, to form an emitter region 20. Then, the polycrystalline silicon layer 19 is patterned by a photolithography and etching process, to leave the polycrystalline silicon layer 19 as an emitter electrode.

Finally, referring to FIG. 2G, in the same way as shown in FIG. 1G, a silicon oxide layer 21 and a BPSG layer 22 are sequentially formed by a CVD process. Subsequently, barrier metal layer 23 and an aluminum electrode layer 24 are sequentially formed by a sputtering process, and are patterned. Thus, a BiCMS device is completed.

In the above-described first embodiment of the present invention as shown in FIGS. 2A through 2G, a photohithography process for forming the photoresist pattern 13 of FIG. 1D of the prior art is unnecessary, thus decreasing the manufacturing cost.

FIGS. 3A through 3G are cross-sectional views showing a second embodiment of the method for manufacturing a semiconductor device according to the present invention. In FIGS. 3A through 3G, a Schottky barrier diode (SBD) is manufactured instead of the bipolar transistor of FIGS. 2A through 2G.

First, referring to FIG. 3A, in the same way as shown in FIG. 2A, an N$^-$-type epitaxial silicon layer 2 is grown on a P-type monocrystalline silicon substrate 1. Then, a field silicon oxide layer 3 is formed by a LOCOS process to partition a PMOS region, an NMOS region and an SBD region. Then, an N$^+$-type impurity diffusion region 4 is selectively formed in a cathode take-out portion of the SBD region, and an N$^+$-type buried layer 5 is selectively formed within the SBD region. Also, phosphorus ions are implanted into the PMOS region, so that an N-type well 6 is formed within the PMOS region, and boron ions are implanted into the NMOS region, so that a P-type well 6' is formed within the NMOS region. Further, boron ions are implanted into a portion between the N$^-$-type epitaxial silicon layer 2 and the N-type well 6, so that a P-type channel stopper 7 is formed.

Next, referring to FIG. 3B, in the same way as shown in FIG. 2B, about a 100 to 150 Å thick gate silicon oxide layer 8 is grown by thermally oxidizing the N$^-$-type epitaxial silicon layer 2, the N$^+$-type impurity region 4, the N-type well 6, and the P-type well 6', in a H$_2$—O$_2$ atmosphere at a temperature of about 750 to 850° C. Then, about a 1000 to 2000 Å thick phosphorus-doped polycrystalline silicon layer 9 is deposited by a CVD process, and about a 1000 to 2000 Å thick refractory metal layer 10, made of WSi or the like, is deposited on the polycrystalline silicon layer 9 by a sputtering process. Further, a protection layer 31 made of silicon or the like, is deposited on the refractor/metal layer 10 by a CVD process. Then, the polycrystalline silicon layer 9, the refractory metal layer 10 and the protection layer 31 are patterned by a photolithography and etching process to form a gate electrode G in the PMOS region and a gate electrode G' in the NMOS region. Then, about 1.0 to 3.0 $\times 10^{13}$ boron ions per cm$^2$ are implanted into the PMOS region by using the gate electrode G and a photoresist pattern (not shown) as a mask, to form P-type impurity diffusion, i.e., source/drain regions 11S and 11D respectively, having a low concentration for an LDD structure. Similarly, about 1.0 to 3.0$\times 10^{13}$ phosphorus ions per cm$^2$ are implanted into the NMOS region by using the gate electrode G' and a photoresist pattern (not shown) as a mask, to form N-type impurity diffusion, i.e., source/drain regions 11S' and 11D', respectively, having a low concentration for an LDD structure.

Next, referring to FIG. 3C, in the same way as in FIG. 2C, about a 1500 to 2500 Å thick silicon oxide layer is deposited by a CVD process on the entire surface. Then, the silicon oxide layer is etched back anistropically by using an RIE process with a gas of CHF$_3$ and O$_2$, to leave it as a sidewall spacer 12 on the sidewalls of the gate electrodes G and G'.

Next, referring to FIG. 3D, in the same way as shown in FIG. 2D, the N$^-$ type epitaxial layer 2, the N$^+$-type impurity diffusion region 4, the P-type impurity diffusion regions 11S and 11D, and the N-type impurity diffusion regions 11S' and 11D' are etched for about 20 minutes by ammonia water in which NH$_4$OH:H$_2$O$_2$:H$_2$O=1:4:20. In this case, only a part of the N$^-$-type epitaxial silicon layer 2, having a thickness of about 0.01 to 0.02 $\mu$m which is damaged by the RIE process for forming the sidewall spacer 12, is removed. The silicon layer 2 removal is performed simultaneously with removing the parts of the N$^+$-type impurity, region 4, the P-type impurity diffusion regions 11S and 11D, and the N-type impurity diffusion regions 11S' and 11D'.

Next, referring to FIG. 3E, in a similar way to that shown in FIG. 2E, about 1.0 to 5.0$\times 10^{15}$ boron ions per cm$^2$ are implanted into the PMOS region and the SBD region by the gate electrode G, its sidewall spacer 12 and a photoresist pattern (not shown) as a mask, to form P-type impurity diffusion, i.e., source/drain regions 14S and 14D, respectively having a high concentration for the LDD structure and P-type impurity diffusion regions 41 for the SBD structure. Similarly, about 1.0 to 5.0$\times 10^{15}$ arsenic ions per cm$^2$ are implanted into the NMOS region by using the gate electrode G', its sidewall spacer 12 and a photoresist pattern (not shown) as a mask, to form N-type impurity diffusion, i.e., source/drain regions 14S' and 14D', respectively, having a high concentration for the LDD structure.

Next, referring to FIG. 3F, in a similar way to that shown in FIG. 2F, about a 2000 Å thick silicon oxide layer 17 is grown by a CVD process on the entire surface. Then, an SBD contact hole is perforated in the silicon oxide layer 17 by a photolithography and RIE process. Then, about 600 Å thick layer is deposited by a CVD process. Then, a heating operation is carried out in a nitrogen atmosphere at a temperature of about 500° C., to form a SBD metal anode electrode 42. Then, the platinum layer is removed.

Figure 3G:
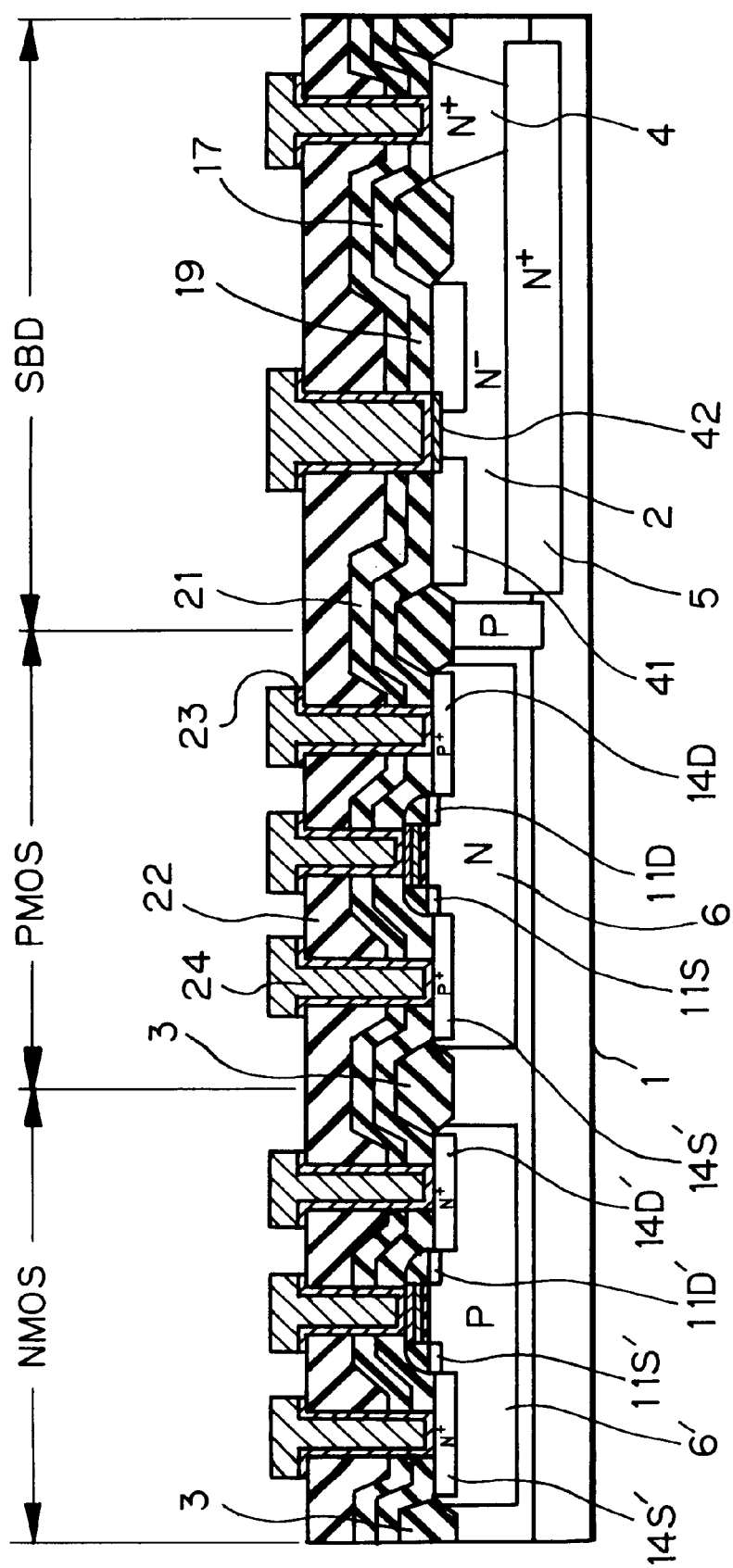

Finally, referring to FIG. 3G, in the same way as shown in FIG. 2G, a silicon oxide layer 21 and a BPSG layer 22 are sequentially formed by a CVD process. Subsequently, a barrier metal layer 23 and an aluminum electrode layer 24 are sequentially formed by a sputtering process, and are patterned. Thus, a CMOS/SBD device is completed.

In the above-described second embodiment of the present invention as shown in FIGS. 3A through 3G, a photolithography process for forming the photoresist pattern 13 of FIG. 1D of the prior art is also unnecessary, thus decreasing the manufacturing cost.

As explained hereinabove, according to the present invention, since a damaged part of a base region of a bipolar transistor or a damaged part of an anode region of a SBD can be removed without the additional photolithography process, the manufacturing cost can be reduced.

I claim:

1. A method for manufacturing a BiMOS device, comprising:

forming a first and second semiconductor layers partitioned on a semiconductor substrate, said first semiconductor layer defining a region where a MOS transistor is formed, said second semiconductor layer defining a region where a bipolar transistor is formed;

forming a gate insulating layer on said first and second semiconductor layers;

forming a gate electrode on said gate insulating layer for said MOS transistor;

forming an insulating layer on said gate electrode;

etching back said insulating layer by reactive ion etching leaving said insulating layer as a sidewall spacer only on a sidewall of said gate electrode; and etching parts of said first and second semiconductor layers by wet etching using said gate electrode and said sidewall spacer as a mask.

2. The method as set forth in claim 1, wherein said wet etching comprises ammonia water.

3. The method as set forth in claim 1, wherein said gate electrode forming step comprises the steps of:

forming a polycrystalline silicon layer on said gate insulating layer;

forming a refractory metal layer on said polycrystalline silicon layer;

forming a protection layer on said refractory metal layer, said protection layer preventing said refractory metal layer from being etched by said wet etching; and etching said protection layer, said refractory metal layer and said polycrystalline silicon layer to form said gate electrode.

4. The method as set forth in claim 3, wherein said protection layer is comprised of silicon.

5. A method for manufacturing a BiCMOS device, comprising:

forming a first, second and third semiconductor layers partitioned on a semiconductor substrate, said first semiconductor layer defining a region where a PMOS transistor is formed, said second semiconductor layer defining a region where an NMOS transistor is formed, said third semiconductor layer defining a region where a bipolar transistor is formed;

forming a gate insulating layer on said first and second semiconductor layers;

forming a first and second gate electrodes on said gate insulating layer for said PMOS transistor and said NMOS transistor respectively;

forming an insulating layer on said first and second gate electrodes;

etching back said insulating layer by reactive ion etching leaving said insulating layer as sidewall spacers only on sidewalls of said first and second gate electrodes; and etching parts of said first, second and third semiconductor layers by wet etching using said first and second gate electrodes and said sidewall spacers as a mask.

6. The method as set forth in claim 5, wherein said wet etching comprises ammonia water.

7. The method as set forth in claim 5, wherein said gate electrode forming step comprises the steps of:

forming a polycrystalline silicon layer on said gate insulating layer;

forming a refractory metal layer on said polycrystalline silicon layer;

forming a protection layer on said refractory metal layer, said protection layer preventing said refractory metal layer from being etched by said wet etching; and etching said protection on layer, said refractory metal layer and said polycrystalline silicon layer to form said first and second gate electrodes.

8. The method as set forth in claim 7, wherein said protection layer is comprised of silicon.

9. A method for manufacturing a MOS device and a Schottky barrier diode, comprising:

forming a first and second semiconductor layers partitioned on a semiconductor substrate, said first semiconductor layer defining a region where a MOS transistor is formed, said second semiconductor layer defining a region where an SBD is formed;

forming a gate insulating layer on said first and second semiconductor layers;

forming a gate electrode on said gate insulating layer for said MOS transistor;

forming an insulating layer on said gate electrode;

etching back said insulating layer by reactive ion etching leaving said insulating layer as a sidewall spacer only on a sidewall of said gate electrode; and etching said first and second semiconductor layers by wet etching using said gate electrode and said sidewall spacer as a mask.

10. The method as set forth in claim 9, wherein said wet etching comprises ammonia water.

11. The method as set forth in claim 9, wherein said gate electrode forming step comprises the steps of:

forming a polycrystalline silicon layer on said gate insulating layer;

forming a refractory metal layer on said polycrystalline silicon layer;

forming a protection layer on said refractory metal layer, said protection layer preventing said refractory metal layer from being etched by said wet etching; and etching said protection layer, said refractory metal layer and said pollycrystalline silicon layer to form said gate electrode.

12. The method as set forth in claim 11, wherein said protection layer is comprised of silicon.

13. A method for manufacturing a CMOS device and a Schottky barrier diode, comprising:

forming a first, second and third semiconductor layers partitioned on a semiconductor substrate, said first semiconductor layer defining a region where a PMOS transistor is formed, said second semiconductor layer defining a region where an NMOS transistor is formed, said third semiconductor layer defining a region where an SBD is formed;

forming a gate insulating layer on said first and second semiconductor layers;

forming a first and second gate electrodes on said gate insulating layer for said PMOS transistor and said NMOS transistor, respectively;

forming an insulating layer on said first and second gate electrodes;

etching back said insulating layer by reactive ion etching leaving said insulating layer as sidewall spacers only on sidewalls of said first and second gate electrodes; and etching said first, second and third semiconductor layers by wet etching using said first and second gate electrodes and said sidewall spacers as a mask.

14. The method as set forth in claim 13, wherein said wet etching comprises ammonia water.

15. The method as set forth in claim 13, wherein said gate electrode forming step comprises the steps of;

forming a polycrystalline silicons layer on said gate insulating layer;

forming a refractory metal layer on said polycrystalline silicon layer;

forming a protection layer on said refractory metal layer, said protection layer preventing said refractory metal layer from being etched by said wet etching; and etching said protection layer, said refractory metal layer and said polycrystalline silicon layer to form said first and second gate electrodes.

16. The method as set forth in claim 15, wherein said protection layer is comprised of silicon.

* * * * *